Figure 1:
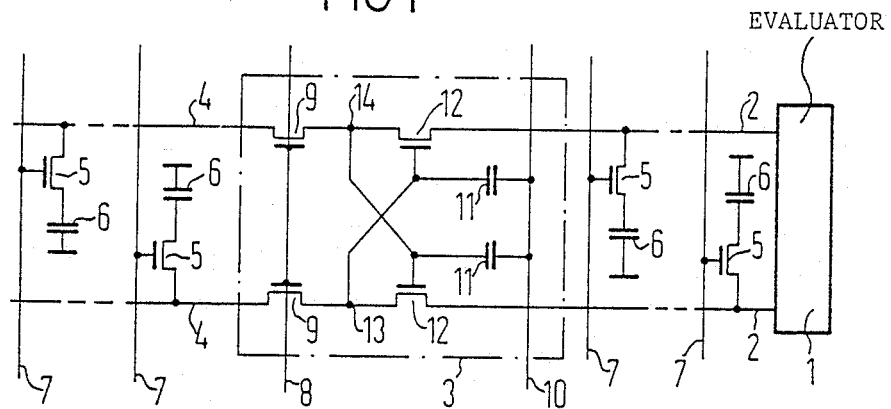

United States Patent [19]
Kraus et al.

[11] Patent Number: 4,803,386
[45] Date of Patent: Feb. 7, 1989

[54] DIGITAL AMPLIFIER CONFIGURATION IN INTEGRATED CIRCUITS

[75] Inventors: Rainer Kraus, München; Oskar Kowarik, Grafing; Manfred Paul, Unterföhring, all of Fed. Rep. of Germany

[73] Assignee: Siemens Aktiengesellschaft, Berlin and München, Fed. Rep. of Germany

[21] Appl. No.: 121,521

[22] Filed: Nov. 17, 1987

[30] Foreign Application Priority Data

Nov. 18, 1987 [DE] Fed. Rep. of Germany ....... 3639347

[51] Int. Cl.⁴ .................. G01R 19/00; H03K 3/26; G11C 7/00
[52] U.S. Cl. ............................ 307/530; 307/443; 307/279; 307/291; 307/355; 365/205; 365/207; 365/208
[58] Field of Search ............... 307/530, 355, 362, 246, 307/279, 291, 443; 365/205, 207, 208

[56] References Cited

U.S. PATENT DOCUMENTS

| 3,774,176 | 11/1973 | Stein et al. | 365/205 |
| 4,123,799 | 10/1978 | Peterson | 365/205 |
| 4,286,178 | 8/1981 | Rao et al. | 307/355 |
| 4,409,678 | 10/1983 | Takemae et al. | 307/246 |
| 4,584,672 | 4/1986 | Schutz et al. | 307/530 |
| 4,716,320 | 12/1987 | McAdams | 365/205 |

FOREIGN PATENT DOCUMENTS 0011448 11/1979 European Pat. Off.
0185572 11/1985 European Pat. Off.

OTHER PUBLICATIONS

Japanese Abstracts, vol. 7, No. 238, JP-A58 125 293, IEEE Journal of Solid State Circuits, vol. SC-15, #5, Oct. 1980.

Primary Examiner—John S. Heyman
Assistant Examiner—Trong Quang Phan
Attorney, Agent, or Firm—Herbert L. Lerner; Laurence A. Greenberg

[57] ABSTRACT

A digital amplifier configuration in integrated circuits for the amplification of a voltage change includes a digital amplifier. The digital amplifier couples pairs of bit lines extended beyond the permissible capacity thereof to extensions of the pairs of bit lines.

3 Claims, 1 Drawing Sheet

DIGITAL AMPLIFIER CONFIGURATION IN INTEGRATED CIRCUITS

The invention relates to a digital amplifier configuration for amplifying a voltage change in integrated circuits, especially in semiconductor memories or stores.

Currently, the concept of the one-transistor cell is used almost exclusively for the storage of information in semiconductor memories or stores, since such a circuit reduces the number of elements for the storage of an information bit to a minimum. The one-transistor cell is formed of a storage capacitor and a selection transistor, which transfers the electric charge stored in the capacitor to a bit line and cuts it off therefrom, under the control of a word line. In order to read the information, the bit line is first biased to a reference voltage, generally 2.5 V, and is then cut off from the voltage source. A charge compensation takes place between the storage capacitor and the bit line as a result of the opening of the selection transistor. A voltage change which is initiated in the bit line is amplified by an evaluator and fed to the output of the memory. In the case of the one-transistor cell, the read-out of the information is destructive, i.e. the information must be fed in again following each read process.

Since the introduction of the one-transistor cell concept, a plurality of types of evaluator structures have been proposed. However, in virtually all dynamic memories or stores, a symmetrical flip-flop is currently used which compares the voltage change on the bit line with a second, identical reference bit line by way of the evaluator and the amplifier. This reference bit line contains the same number of one-transistor cells and is connected either in parallel to the bit line or symmetrical to the evaluator. The bit line and reference bit line together form a pair of bit lines, having voltage changes which are digitized by the evaluator.

The voltage changes on the bit lines are dependent upon the ratio of the capacity of the bit line to the capacity of an individual storage cell. In order to enable the evaluator to clearly distinguish the voltage change from disturbing spurious signals, as a rule the bit line capacity must not be allowed to exceed ten-times the capacity of a storage cell. As a result only a limited number of one-transistor cells can be connected for each bit line. Consequently, an increase in the storage capacity inevitably results in an increase in the number of evaluators in proportion to the number of the one-transistor cells.

It is accordingly an object of the invention to provide a digital amplifier configuration in integrated circuits, which overcomes the hereinafore-mentioned disadvantages of the heretofore-known devices of this general type and which reduces the surface area of the chip required in semiconductor memories or stores for the storage of information.

With the foregoing and other objects in view there is provided, in accordance with the invention, a digital amplifier configuration in integrated circuits for the amplification of a voltage difference or change, comprising pairs of bit lines extended beyond the permissible capacity thereof, extensions of said pairs of bit lines, and a digital amplifier coupling said pairs of bit lines to said extensions.

Double the number of one-transistor cells can be connected to each evaluator by installing a digital amplifier for each pair of bit lines. This can advantageously be used either to double the storage capacity while retaining the same number of evaluator or to halve the number of evaluators while retaining the same storage capacity. Since the surface area requirement of a digital amplifier is less than that of an evaluator, in either case this leads to a reduction in surface area.

A further advantage is achieved when the number of storage cells per bit line pair and per extension is reduced below the maximum permissible number with regard to the capacity ratio, by virtue of the provision of a digital amplifier. Since a reduction in the length of the bit line also reduces the capacity thereof, the voltage change which occurs when reading out a storage cell in the pair of bit lines is greater. This effect can either be exploited in order to reduce the capacity and thus the surface area of each individual storage cell or to increase the fault resistance of the semiconductor circuit.

In accordance with another feature of the invention, the digital amplifier includes a clock line and isolating transistors controlled by the clock line for connecting the extensions to and cutting the extensions off from the respective pair of bit lines.

In accordance with a further feature of the invention, there is provided an evaluator connected to the pair of bit lines, the digital amplifier including a pair of cross-coupled transistors amplifying voltage differences of the extensions and transferring the voltage differences to the pair of bit lines for further processing in the evaluator.

In accordance with an added feature of the invention, there is provided a an external pulse line, and capacitors connecting the pair of cross-coupled transistors to the external pulse line.

In accordance with a concomitant feature of the invention, the digital amplifier includes a transistor configuration for regenerating read information in the extensions.

Other features which are considered as characteristic for the invention are set forth in the appended claims.

Although the invention is illustrated and described herein as embodied in a digital amplifier configuration in integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
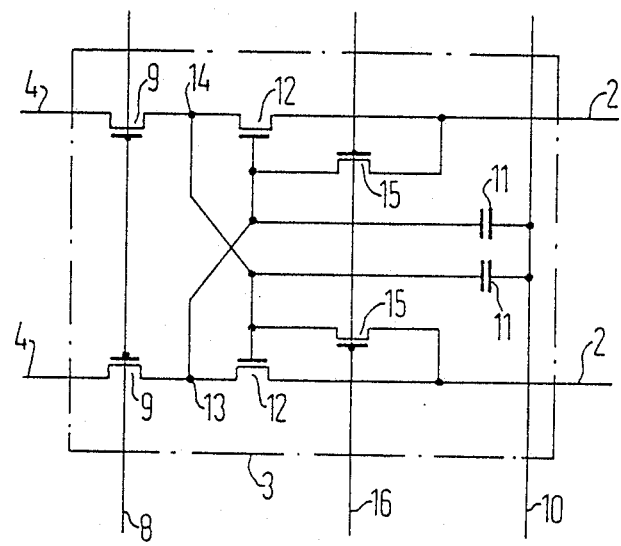

FIG. 1 is a schematic and block circuit diagram of a circuit configuration according to the invention including a digital amplifier, a pair of bit lines, an extension and an evaluator; and FIG. 2 is a schematic circuit diagram of the digital amplifier shown in FIG. 1 in an extended transistor circuit for the regeneration of read information.

Referring now to the figures of the drawings in detail and first, particularly, to FIG. 1 thereof, there is seen an evaluator 1 with a pair of bit lines 2, 2. The bit lines 2, 2 of the pair are connected to extensions 4, 4 of the bit lines through a digital amplifier 3. The bit line pair 2, 2 and the extensions 4, 4 are connected to one-transistor cells each including a selection transistor 5 and a storage capacitor 6. The gates of the selection transistors 5 are connected to separate word lines 7. In the digital amplifier 3, a clock line 8 leads to two isolating transistors 9, 9, and a pulse line 10 leads through coupling capacitors 11, 11 to two cross-coupled transistors 12, 12 having gate terminals connected to nodes 13 and 14.

In the fundamental or original state, the extensions 4, 4 are cut off from the pair of bit lines 2, 2 by the transistors 12, 12 which are open. Thus the read-out of the data from the storage capacitors which are coupled to the pair of bit lines 2, 2 proceeds in a conventional manner, uninfluenced by the digital amplifier 3 and the extensions 4, 4, since the voltage change in the pair of bit lines 2, 2 is evaluated by the evaluator 1, amplified and forwarded.

If, on the other hand, a one-transistor cell located in the extensions 4, 4 is read, a voltage difference first occurs between the nodes 13 and 14 and this difference remains even when the extension 4, 4 has been cut-off by opening the isolating transistors 9, 9. A pulse supplied to the two coupling capacitors 11, 11 serves to pull-up the two nodes 13 and 14 until the member of the two cross-coupled transistors 12, 12 which has the higher gate voltage becomes conductive. As a result, the charge of the capacitor is discharged to the corresponding bit line where it produces a voltage change which is read by the evaluator in the usual way. The voltage change emitted by the digital amplifier is thus greater than the voltage difference between the nodes 13 and 14. The actual magnitude of the output signal is governed by the magnitude of the signal of the pulse line 10 and by the ratio of the coupling capacitors 11, 11 to the capacities of the bit lines 2, 2 and is thus independent of the magnitude of the input signal.

In FIG. 2 the digital amplifier 3 in FIG. 1 has been supplemented by two regenerating transistors 15, 15 which are controlled by generating clock lines 16.

In order to regenerate the information of the storage capacitors located in the extensions 4, 4 which is destroyed during the read-out, the regenerating transistors 15, 15 are opened by a pulse from the regenerating clock line 16. The regenerating signal which emanates from the evaluator can thus be fed into the extension 4, 4 again through the pair of bit lines 2, 2.

The foregoing is a description corresponding in substance to German Application No. P 36 39 347.9, dated Nov. 18, 1986, the International priority of which is being claimed for the instant application, and which is hereby made part of this application. Any material discrepancies between the foregoing specification and the aforementioned corresponding German application are to be resolved in favor of the latter.

We claim:

1. Digital amplifier arrangement in an integrated circuit for amplification of a voltage difference, comprising a pair of bit lines having a pair of respective extension lines connected thereto via respective isolation transistors; a clock line controlling the isolation transistors; a digital amplifier containing the isolation transistors, said digital amplifier having a pair of cross-connected transistors for amplifying a voltage difference between said extension lines; and an evaluator connected to said cross-connected transistors via said bit lines for reading said voltage difference between the extension lines.

2. Digital amplifier arrangement according to claim 1, including coupling capacitors connected to gates of the cross-connected transistors, and a pulse line connected to said gates via said capacitors.

3. Digital amplifier arrangement according to claim 1, including an arrangement of transistors connected to said gates of said cross-connected transistors for regenerating the voltage difference read out from said extension lines.

* * * * *

UNITED STATES PATENT OFFICE
CERTIFICATE OF CORRECTION

PATENT NO. : 4,803,386

DATED : Feb. 7, 1989

INVENTOR(S) : Kraus et al

It is certified that error appears in the above-identified patent and that said Letters Patent is hereby corrected as shown below:

In the Title Page, item (30)
 "Nov. 18, 1987"
 Should be:
 "Nov. 18, 1986"

Signed and Sealed this

Second Day of January, 1990

Attest:

JEFFREY M. SAMUELS

Attesting Officer   Acting Commissioner of Patents and Trademarks